United States Patent [19]

Nakayama

[11] 3,939,384
[45] Feb. 17, 1976

[54] ELECTRIC TIMER SWITCH
[75] Inventor: Hiroshi Nakayama, Shizuoka, Japan
[73] Assignee: Iwatani & Co., Ltd., Osaka, Japan
[22] Filed: Oct. 2, 1974
[21] Appl. No.: 511,251

[52] U.S. Cl. .............................................. 317/141 S
[51] Int. Cl.² ......................................... H03H 9/30
[58] Field of Search .................................. 317/141 S

[56] References Cited
UNITED STATES PATENTS

| | | |
|---|---|---|
| 3,688,130 | 8/1972 | Granieri........................... 317/141 S |
| 3,728,588 | 4/1973 | Jones................................ 317/141 S |
| 3,774,082 | 11/1973 | Chang............................... 317/141 S |
| 3,814,948 | 6/1974 | Schuchmann et al. ........... 317/141 S |

Primary Examiner—R. N. Envall, Jr.
Attorney, Agent, or Firm—David A. Blumenthal; Arthur Schwartz

[57] ABSTRACT

An electronic timer switch capable of controlling the operation of a unit, such as an air conditioning apparatus, according to a preset time schedule even when the unit is switched on.

10 Claims, 3 Drawing Figures

ELECTRIC TIMER SWITCH

The invention relates to an electronic timer switch adapted for use in a unit requiring a certain period of off time before it is re-started, such as an air conditioning apparatus.

More specifically, the invention is concerned with an electronic timer switch capable of controlling the operation of a unit, such as an air conditioning apparatus, according to a pre-set time schedule, and has as an object the provision of a timer switch preventing the re-starting of the unit within a certain time interval.

In accordance with the present invention the timer switch includes a programmable unijunction transistor (hereinafter referred to as PUT), having its gate connected to a capacitor through a diode and a resistance, so as to energize the PUT through the discharging of the capacitor. The switch also includes a transistor having its collector connected to the capacitor through a second resistance and a second diode, the emitter of the transistor being connected to a power supply. The transistor and the capacitor are interconnected such that the capacitor is charged through the conduction of the transistor when a load is switched on; whereas, the capacitor is discharged through the cut-off of the transistor when the load is switched off.

The invention will be more particularly described by way of example, with reference to the accompanying drawings, wherein.

Figure 1:
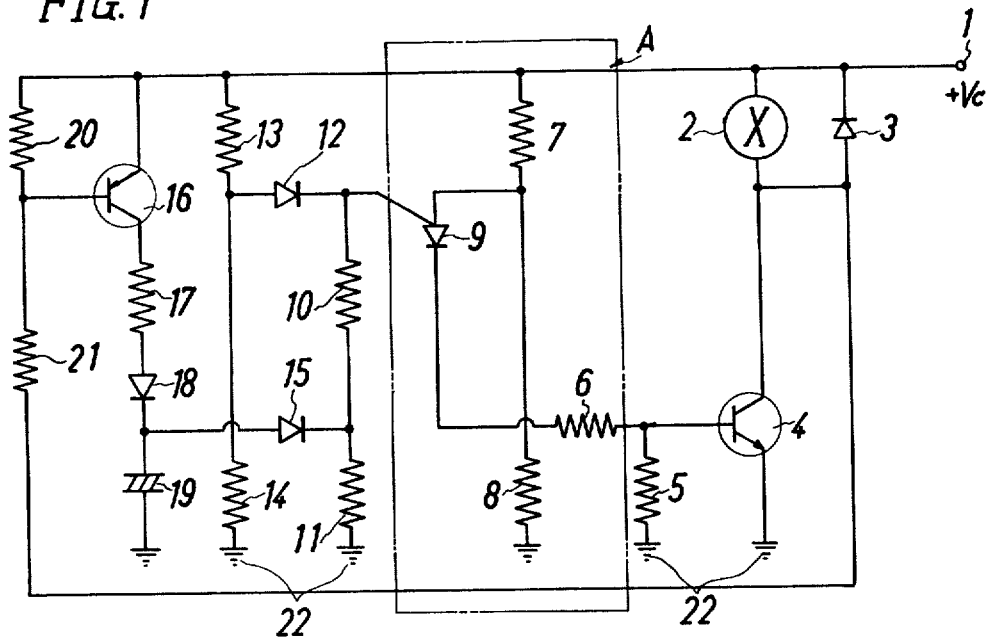
FIG. 1 is an electrical diagram of a whole system according to the present invention.

Referring to FIG. 1, the circuit is connected to a power supply through a terminal 1 and has a relay-switch 2 connected to the collector of a transistor 4. The emitter of transistor 4 is connected to ground at 22. The base of the transistor 4 is connected through a pair of resistances 5 and 6 to the cathode of a programmable unijunction transistor (PUT) 9. In parallel with the relay switch 2, there is provided a diode 3 for absorbing surges.

The anode of the PUT 9 is connected to a voltage divider including resistances 7 and 8, and the gate thereof is connected to a voltage divider including a pair of resistances 13 and 14 through a diode 12. Between ground and the gate of the PUT 9 there are a pair of resistances 10 and 11 connected to a capacitor 19 through a diode 15.

A transistor 16 has an emitter connected to the power supply terminal 1 and a collector connected to the capacitor 19 through a resistance 17 and a diode 18. The base is connected to a pair of resistances 20 and 21, wherein the resistance 20 is also connected to the terminal 1, while the resistance 21 is also connected to the collector of the transistor 4.

The system thus described operates as follows:

D.C. power is applied between the terminal 1 and ground 22. Because the combined value of the resistances 10 and 11 is larger than that of the resistance 14, the gate voltage of the PUT 9 is substantially equal to the voltage divided by the resistances 13 and 14; and the anode voltage thereof is substantially equal to the voltage divided by the resistances 7 and 8, provided that the capacitor 19 has not been charged.

In this situation the PUT 9 is ready for its "ON" position with a higher voltage across the anode than the gate. Thus, the PUT 9 is "ON", and its base current from the cathode is delivered to the transistor 4 through the resistances 5 and 6 so as to turn on same, thereby actuating the relay 2.

When the transistor 4 is on, it supplies a base current to the transistor 16 through the resistance 21, thereby energizing same. When the transistor 16 is energized, the capacitor 19 which is connected to the collector of the transistor 16 is charged. The impedance occurring during the charging of capacitor 19 is previously adjusted so as to be smaller than that across the line from the capacitor 19 to the diode 15; and the charging voltage will rise nearly to the level of the line voltage $V_c$ at terminal 1. In this situation, when the power supply is cut off, the capacitor starts to discharge through the diode 15 and the resistance 11, wherein the voltage between the terminals of the capacitor is applied across the gate of the PUT 9 through the diode 15 and the resistance 10.

Here again when DC power is again applied, the transistor 4 is turned on; but, unless tha capacitor has discharged up to the level at which the anode voltage is higher than the gate voltage, the PUT 9 will remain in its OFF position, thereby keeping the OFF position of the transistor 4. The relay 2 is equally kept out of operation. At this stage the transistor 16 is likewise in the OFF position because its base voltage is equal to the line voltage.

In this way the capacitor continues to discharge until the anode voltage becomes higher than the gate voltage, where the PUT 9 is energized thereby ensuring the conduction of the transistor 4, thus actuating the relay 2. This enables the transistor 16 to conduct, through which the capacitor 19 is charged, ready for the first switching "ON" after power is cut off.

The timer switch of the present invention can be incorporated in an air conditioning unit, particularly as a starting timer of a compressor. The advantages of the timer switch are as follows:

Normally the electric motor of the compressor is subjected to detrimental overloading because of an insufficient liquid pressure in the compressor when, during the "OFF" period of the compressor, the motor is started before a given time interval expires. However, according to the present invention the operation of the compressor will be delayed until the time interval is safely reached, thereby preventing overloading the motor.

Figure 2:
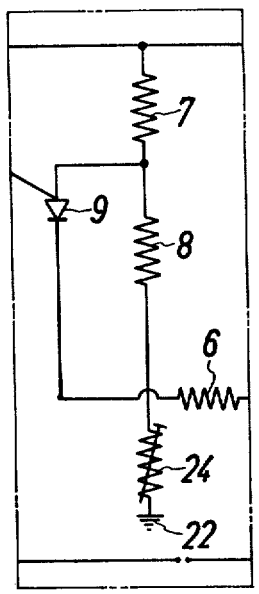
FIG. 2 is an electrical diagram of a preferred modification of the portion shown as A in FIG. 1.

Referring to FIG. 2, in which the portion A in FIG. 1 is replaced by a modified system, the system is featured by a variable resistor 24 positioned between the resistance 8 and ground 22. The resistor 24 is intended to compensate for errors in timing due to possible variations of each component. The individual errors are likely to appear, when accumulated, as an error in operational time. However, by adjusting the variable resistor 24, the anode voltage of the PUT 9 can be pre-set higher when the timing is erroneously fast, whereas when the timing is slow its anode voltage can be pre-set lower, thus keeping the timing constant.

Figure 3:
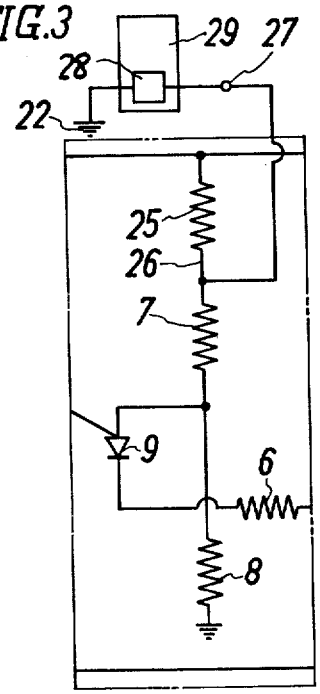
FIG. 3 is an electrical diagram of a further modification of the portion shown as A in FIG. 1.

Referring to FIG. 3, in which a further modified system is shown, a resistance 25 is additionally put between the power supply 1 and the resistance 7. The connection 26 of the resistances 7 and 25 is connected to a control input terminal 27, which is connected to a control circuit 29 through a suitable switching means 28. The switching means of contact or non-contact type can switch between "open" and "short" with respect to ground 22, and it is arranged that when it is switched to "open" the anode of the PUT 9 is energized. As evident from the foregoing, by simply turning the switching means 28 either to "open" or "short" the same result will be obtained as when the system is directly connected or disconnected with respect to the power supply.

What is claimed is:

1. A timing apparatus comprsing:
   a a programmable unijunction transistor having an anode, a gate and a cathode;
   b timing means connected to the gate of said programmable unijunction transistor for energizing said programmable unijunction transistor;
   c a power supply; and
   d a second transistor connected to said timing means and to said power supply providing energy from said power supply to said timing means.

2. A timing apparatus as recited in claim 1 wherein said timing means comprises:
   a a capacitor;
   b first unidirectional conductance means connected to said capacitance;
   c second unidirectional conductance means connected to said capacitance;
   d first resistive means connecting said first unidirectional conductance means to the gate said programmable unijunction transistor; and
   e second resistive means connecting said second unidirectional conductance means to said second transistor, whereby said capacitance is charged by conduction of said second transistor;

3. A timing apparatus as recited in claim 1 wherein a third transistor is connected to said programmable unijunction transistor to receive current therefrom, whereby said third transistor is turned on and off by said programmable unijunction transistor.

4. A timing apparatus as recited in claim 3 wherein said third transistor includes a collector for connection to a relay switch for controlling same.

5. A timing apparatus as recited in claim 4 wherein a diode is connected in parallel with said relay switch.

6. A timing apparatus as recited in claim 1 wherein a variable resistance is connected in the circuit of the programmable unijunction transistor.

7. A timing apparatus as recited in claim 1 wherein:
   a a third resistance means is connected to the anode of said programmable unijunction transistor for connection to an input terminal; and
   b switching means is connected to said input terminal for grounding said input terminal and removing power from said programmable unijunction transistor.

8. A timing apparatus as recited in claim 4 wherein said second transistor comprises a base, said base being connected to said collector of said third transistor; whereby said second transistor is placed in a conductive state on application of voltage from said power supply only if said third transistor is in a conducting state.

9. A timing apparatus as recited in claim 2 wherein:
   a said first resistive means and said first unidirectional conductance means connected thereto are connected to a ground point by a third resistive means;
   b said anode of said programmable unijunction transistor is connected by a fourth resistive means to said power supply;
   c said anode of said programmable unijunction transistor is connected by a fifth resistive means to a ground point, said fifth and fourth resistive means forming a first voltage divider for said anode;
   d said gate of said programmable unijunction transistor is connected by a third unidirectional conductance means to a second voltage divider comprising a sixth and a seventh resistive means, said sixth resistive means being connected to a ground point and said seventh resistive means being connected to said power supply;
   e said first voltage divider provides a voltage at said anode greater than a voltage provided by said second voltage divider to said gate;
   f said third resistive means is substantially greater than said second resistive means;
   g said first and third resistive means provide a resistance substantially higher than said sixth resistive means;
   whereby said programmable unijunction transistor is caused to be conductive in response to an application of voltage from said power supply when said capacitor is discharged, and
   whereby said programmable unijunction transistor is caused not to be condutive when voltage is applied from said power supply and said capacitor is charged and provides said gate of said programmable unijunction transistor with a voltage greater than a voltage provided by said first voltage divider to said anode of said programmable unijunction transistor.

10. A timing apparatus comprising:
    a a power supply
    b a programmable unijunction transistor having first, second, and third electrodes, said second electrode of said programmable unijunction transistor being connected to said power supply;
    c timing means connected to said first electrode of said programmable unijunction transistor for energizing said programmable unijunction transistor;
    d a second transistor having first, second and third electrodes, said third electrode of said second transistor being connected to said timing means and said second electrode of said second transistor being connected to said power supply for providing energy from said power supply to said timing means;
    e a third transistor having first, second and third electrodes,
    said first electrode of said third transistor being connected to said third electrode of said programmable unijunction transistor for causing said third transistor to be turned on and off,
    said third electrode of said third transistor being connected to a ground point, and
    said second terminal of said third transistor being connected to a switching means for controlling said switching means;
    said second terminal of said third transistor being further connected to said first terminal of said second transistor for providing a feedback path for controlling said second transistor and said timing means when said power supply is connected to said timing apparatus, whereby said third transistor controls said switching means responsive to lapsing of a variable amount of time subsequent to the connection of said power supply, said variable amount of time being determined by a change in charge stored in said timing means, said change in charge being determined by a second amount of time lapsing from a previous disconnection of said power supply, and whereby charging of said timing means is controlled by conductivity of said third transistor.

* * * * *